(12) United States Patent
Bhowmik et al.

(10) Patent No.: US 6,323,078 B1
(45) Date of Patent: Nov. 27, 2001

(54) METHOD OF FORMING METAL OXIDE METAL CAPACITORS USING MULTI-STEP RAPID THERMAL PROCESS AND A DEVICE FORMED THEREBY

(75) Inventors: Siddhartha Bhowmik; Sailesh M. Merchant; Pradip K. Roy; Sidhartha Sen, all of Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/418,106

(22) Filed: Oct. 14, 1999

(51) Int. Cl.[7] .................................................. H01L 21/8234
(52) U.S. Cl. ........................ 438/238; 438/210; 438/239; 438/240; 438/386; 438/399; 438/396; 257/296
(58) Field of Search ..................................... 438/238, 210, 438/239, 386, 399, 287, 240, 396; 257/296

(56) References Cited

U.S. PATENT DOCUMENTS

| | | | |
|---|---|---|---|
| 3,679,942 | * 7/1972 | Daly ..................................... | 29/25.42 |
| 4,481,283 | * 11/1984 | Kerr et al. ............................ | 430/319 |
| 5,576,240 | * 11/1996 | Radosevich et al. ................ | 438/396 |
| 5,903,493 | * 5/1999 | Lee ....................................... | 438/396 |
| 6,235,594 | * 5/2001 | Merchant et al. .................... | 438/287 |

* cited by examiner

Primary Examiner—Matthew Smith
Assistant Examiner—B. V. Keshavan

(57) ABSTRACT

The present invention provides a method of forming a metal oxide metal (MOM) capacitor on a substrate, such as a silicon substrate, of a semiconductor wafer in a rapid thermal process (RTP) machine. The MOM capacitor is fabricated by forming a metal layer on the semiconductor substrate. The metal layer is then subjected to a first rapid thermal process in a substantially inert but nitrogen-free atmosphere that consumes a portion of the metal layer to form a first metal electrode layer and a silicide layer between the first metal electrode and the semiconductor substrate. The semiconductor wafer is then subjected to a second rapid thermal process. During this process, the remaining portion of the metal layer is oxidized to form a metal oxide on the first metal electrode, which serves as the dielectric layer of the MOM capacitor. Following the formation of the dielectric layer, a second metal electrode layer is then conventionally formed on the metal oxide, which completes the formation of the MOM capacitor. Preferably, the first electrode layer and the metal oxide layer are formed in a single RTP machine.

15 Claims, 4 Drawing Sheets

METHOD OF FORMING METAL OXIDE METAL CAPACITORS USING MULTI-STEP RAPID THERMAL PROCESS AND A DEVICE FORMED THEREBY

TECHNICAL FIELD OF THE INVENTION

The present invention is directed, in general, to a method of forming a semiconductor device and, more specifically, to a method of forming metal oxide metal capacitors using a multi-step rapid thermal process and a semiconductor device that is formed from that process.

BACKGROUND OF THE INVENTION

Throughout the evolution of integrated circuits, an objective of device scaling has been to increase circuit performance and to increase the functional complexity of the circuits as efficiently as possible. Additionally, as larger demands have been placed on today's integrated circuits, it has become highly desirable to integrate various electrical components into the overall circuit design.

One such electrical device that has been recently integrated into the circuit design is the metal oxide metal (MOM) capacitor. Typically, as indicated by the name, a MOM capacitor consists of a first metal electrode covered by an oxide layer, which is, in turn, covered by a second metal electrode. While the MOM capacitor's incorporation into integrated circuit design has been widely accepted, its incorporation has brought certain problems into the fabrication process, such as contamination problems, metal diffusion into the oxide and multiple processing steps that are required to achieve the desired structure.

During the MOM capacitor's production, a different machine is required to deposit each of the capacitor's layers. The first metal electrode is formed in one or more deposition chambers of a metal deposition machine by depositing a metal stack (commonly Ti/TiN) on a substrate (typically silicon), which is then subjected to a temperature sufficient to form a metal silicide interface between the substrate, which typically contains silicon, and the metal layer. After forming the first metal electrode, the partially constructed device is removed from the metal deposition chamber and moved to another chamber having an oxide deposition chamber where the oxide layer of the MOM capacitor is deposited. Next, the apparatus is then returned a metal deposition machine to form the second metal electrode of the capacitor.

By requiring multiple steps and multiple machines to complete the capacitor fabrication, the chances of exposure to numerous contaminants and possible misprocessing steps is substantially increased. Over time and after fabricating multiple lots of devices, contaminants from previous lots tend to remain within the various chambers, constituting risks to later lots placed within the same chamber. Previously, small concentrations of contaminants did not pose serious problems for manufacturers when the semiconductor structures were rather large. Unfortunately, with semiconductor dimensions rapidly shrinking, contaminants, which once were not a chief concern, now pose a strong possibility of limiting yield and reduced revenue from product. In response, manufacturers now seek ways of reducing the exposure of semiconductor devices to contaminants during production. In light of these risks, manufacturers constantly seek ways to reduce the risk of contamination of their devices and misprocessing steps.

Another problem associated with conventional processes is metal diffusion into the oxide, which can cause leakage or malfunction within the capacitor. As previously mentioned, the oxide is deposited in a different machine than one in which the metal electrode is deposited. As such, the oxide is typically very different from the metal. For example, the metal electrode may be titanium and the oxide may be silicon dioxide. In such instances, the titanium may diffuse into the silicon dioxide, which may lead to the previously mentioned problems.

Also, as discussed above, the present conventional processes require multiple steps and multiple tools, which may result in misprocessing the wrong recipe, etc. The metal is deposited in one tool and the oxide is deposited in another. Because of the extra steps required to move the wafer from one tool to another, these multiple steps are costly in both time and money and are, therefore, inefficient.

Accordingly, what is needed in the art is method that addresses the deficiencies associated with the present conventional processes discussed above.

SUMMARY OF THE INVENTION

To address the above-discussed deficiencies of the prior art, the present invention provides a method of forming a metal oxide metal (MOM)capacitor on a substrate, such as a silicon substrate, of a semiconductor wafer in a rapid thermal processor (RTP). In a preferred embodiment, the MOM capacitor is fabricated by forming a metal layer on the semiconductor substrate. The metal layer is then subjected to a first RTP. During this step, a portion of the metal layer is converted to a metal silicide layer between the metal layer and the semiconductor substrate. Then another portion of the metal layer is converted or oxidized to form a metal oxide from the metal layer. The portion of the metal layer that is not converted to the metal silicide or metal oxide serves as the underlying first metal electrode. The metal oxide serves as the dielectric layer of the MOM capacitor. Following the formation of the dielectric layer, a second metal electrode layer is then conventionally formed on the metal oxide, which completes the formation of the MOM capacitor. In one particularly advantageous embodiment of the present invention the first electrode layer and the metal oxide layer are formed in a single RTP machine or tool.

In an alternative embodiment, however, the method further comprises subjecting the metal layer, during the first RTP, to a substantially inert but nitrogen-free atmosphere prior to subjecting the metal layer to a second rapid thermal process.

Thus, in a broad scope, the present invention provides a method wherein the bottom electrode and dielectric layer of the MOM capacitor are formed in a single tool and from a single metal layer without the additional steps associated with conventional processes, which typically includes separate tools and steps for forming the bottom electrode and the oxide layer. Moreover, as just discussed above, other aspects of the present invention further provide the benefit of fabricating at least the MOM capacitor's bottom electrode and dielectric layer in a single RTP tool/apparatus. This provides the advantage of eliminating not only extra processing steps, but also eliminates the need to move the semiconductor wafer to different tools, thereby saving time, manufacturing costs and reducing possible contamination and misprocessing problems.

The metal layer in the present invention may be selected from several well known metals that are used in the fabrication semiconductor wafer. By way of example only, the metal layer may be tantalum, titanium, cobalt, nickel, molybdenum or combinations thereof.

As with most semiconductor wafer fabrication processes, processing temperatures play an important role, which is the case for the present invention. Thus, in one embodiment, subjecting the metal layer to a first rapid thermal process includes subjecting the metal layer to a rapid thermal process having a temperature ranging from about 400° C. to about 900° C., and in another, subjecting the metal layer to a second rapid thermal process includes subjecting the metal layer to a rapid thermal process having a temperature ranging from about 500° C. to about 1100° C.

A particularly advantageous embodiment of the present invention includes forming a metal silicide as a part of or as the first metal electrode layer. The metal silicide is formed from a portion of the metal layer during the first rapid thermal process. It should be understood that the metal silicide discussed herein is intended to include a self-aligned silicide, commonly known as a salicide. In various embodiments, forming a metal silicide includes forming a metal silicide selected from either tantalum silicide, titanium silicide, cobalt silicide, nickel silicide or molybdenum silicide. Other known metal silicides are, of course, within the scope of the present invention.

In another embodiment, the metal oxide is formed by subjecting the remaining portion of the metal layer to a second rapid thermal process in an atmosphere containing oxygen that includes introducing a flow of oxygen having a flow rate ranging from about 1 slm to about 40 slm into the tool/apparatus to oxidize the remaining portion of the metal layer. However, it should be understood that the flow range may vary from tool to tool or even vary depending on wafer size.

In yet another aspect, the present invention provides a semiconductor device fabricated in accordance with the present invention. In one such embodiment, the semiconductor device includes a silicon substrate and a MOM capacitor formed on the silicon substrate. The MOM capacitor includes a first electrode layer formed on the silicon substrate that comprises a metal silicide, which forms at least a portion, if not all, of the electrode metal. The metal oxide layer is formed on the first metal electrode layer and comprises a remaining portion of the electrode metal. The second electrode layer is formed on the metal oxide.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1A:
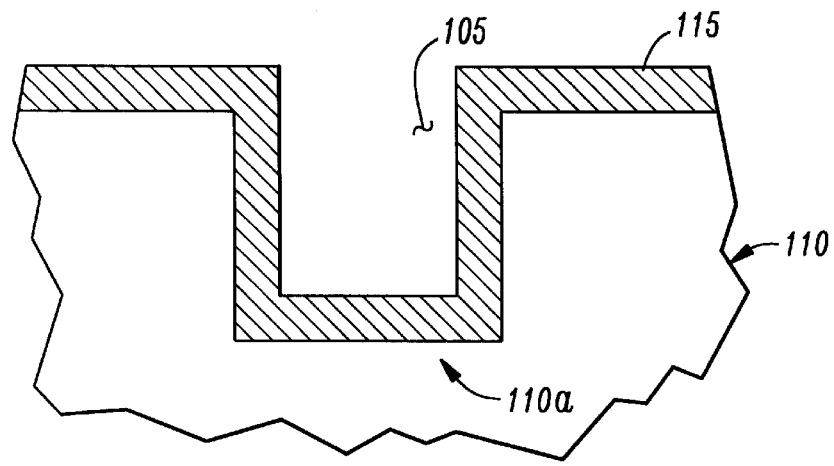
FIGS. 1A–1D illustrate partial sectional views of intermediate devices produced by a method covered by the present invention.
Figure 1B:
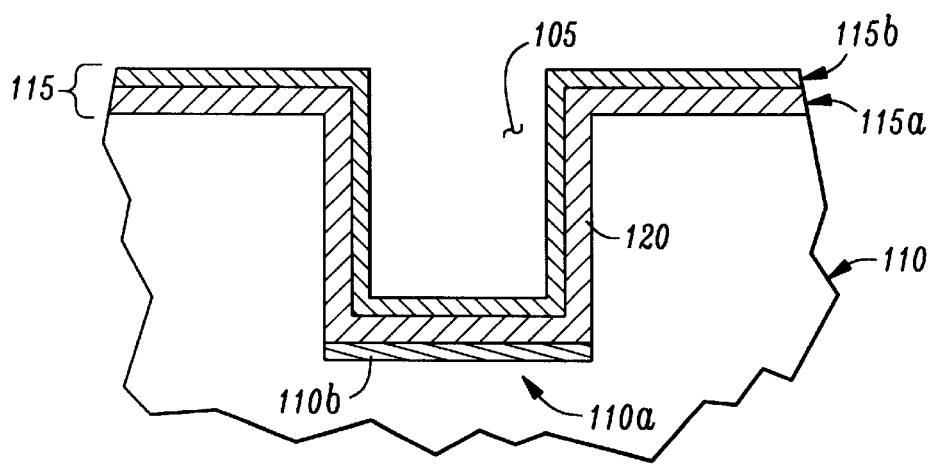
Figure 1C:
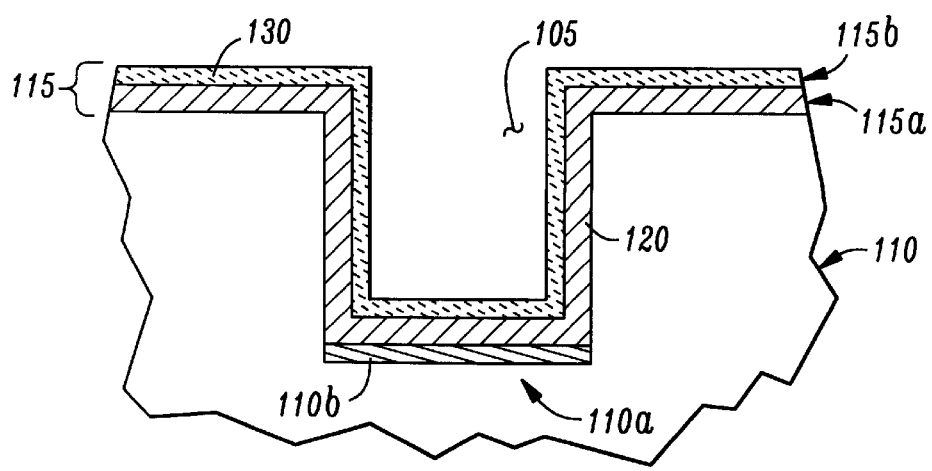

Referring initially to FIGS. 1A–1C, illustrated are partial cross-sectional views of intermediate structures during the fabrication process covered by the present invention. An opening 105 is first conventionally formed in a semiconductor substrate 110, such as a dielectric substrate, a polysilicon substrate or a silicon substrate. Following the formation of the opening 105, a metal layer 115 is deposited by well known deposition processes, such as physical vapor deposition, which forms a contact at an active region, such as a polysilicon gate or source/drain area, of a transistor (not shown). In an advantageous embodiment, the metal may be selected from the group consisting of tantalum (Ta) titanium (Ti), cobalt (Co), nickel (Ni), molybdenum (Mo) or combinations thereof.

FIG. 1B shows the formation of a first metal electrode 120. A first RTP process is conducted as discussed below. By way of the first RTP process, a portion 115a of the metal layer 115 that contacts the underlying polysilicon or silicon substrate 110a is converted to form the first metal electrode 120. In addition, however, the metal layer portion 115a may also react with the substrate 110a to form a metal silicide region 110b at the interface between the metal layer 115 and the substrate 110a. Depending on the metal layer 115 used, the resulting metal silicide may be tantalum silicide, titanium silicide, cobalt silicide, nickel silicide, or molybdenum silicide. Those skilled in the art will recognize that a metal self-aligned silicide, also known as a salicide, may be formed. Furthermore, in an advantageous embodiment, the first RTP is conducted in a neutral atmosphere, such as an argon atmosphere, that is substantially inert but substantially nitrogen-free at a temperature ranging from about 400° C. to about 900° C. What is meant by substantially nitrogen-free is that not enough nitrogen is present to prevent the formation or adversely affect the operation of the components of the MOM capacitor. The amount of time that the device is subjected to the temperature may depend on design parameters. However, in one embodiment, the device may be subjected to the above-stated temperature range for a period of time ranging from about 3 seconds to about 2 minutes. At the conclusion of this RTP procedure, a portion 115b of the metal layer 115 remains unreacted, as illustrated. The amount or thickness of the remaining portion will vary depending on the desired thickness of the first metal electrode layer 120 and the RTP treatment.

FIG. 1C shows a metal oxide 130 formed in another step of the fabrication process. By way of a second RTP, the remaining metal layer portion 115b of FIG. 1B is oxidized in an atmosphere containing oxygen to form the metal oxide 130 on the underlying first metal electrode 120. A particularly distinct advantage provided by the present invention is that the formation of the first metal electrode 120 of FIG. 1B and the formation of the metal oxide 130 may be performed in a single RTP chamber, which saves time and fabrication costs and reduces potential contamination. Alternatively, the metal oxide 130 could also be formed by a rapid thermal chemical vapor deposition (RTCVD) process or a wet process in a RTP chamber. An advantage, however, arises from the fact that the device does not necessarily need to be moved to a separate chamber in order to form the oxide as required by conventional processes, which reduces the chance of contamination and misprocessing. Moreover, because the metal oxide layer 130 comprises the same metal as the first metal electrode 120, the possibility of diffusion of the metal into the oxide is also substantially reduced, unlike the above-discussed conventional process. In advantageous embodiments, the second RTP includes introducing a flow of oxygen having a flow rate ranging from about 1 slm to about 40 slm into the tool/apparatus at temperatures ranging from about 500° C. to about 1100° C. and for a period of time ranging from about 1 second to about 2 minutes. However, flow rates, temperatures and residence times may vary depending, of course, on the design requirements of the transistor.

Figure 1D:
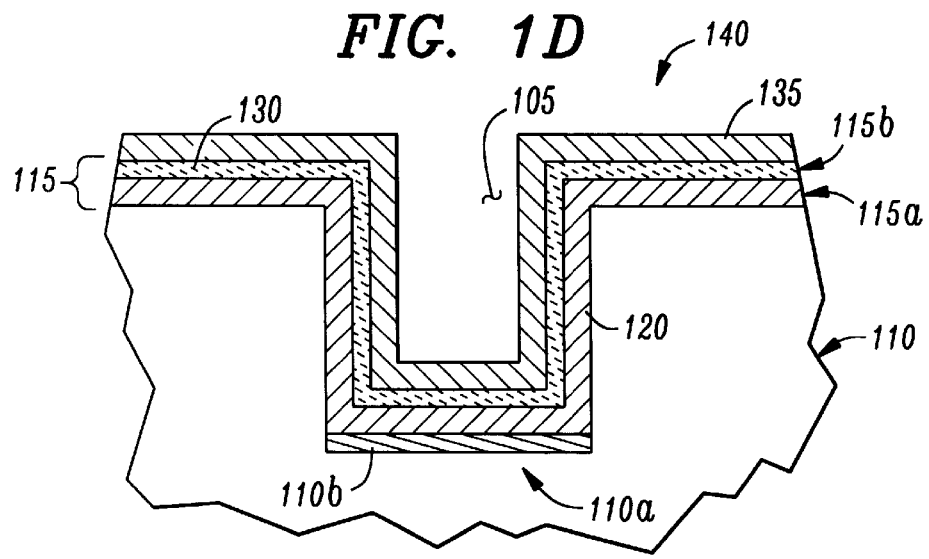

Finally, FIG. 1D is a partial sectional view of the MOM capacitor after the formation of a second metal electrode 135 subsequent to the formation of the metal oxide layer 130 and which completes the formation of a MOM capacitor 140. The second metal electrode 135 may be formed by conventional deposition processes, such as sputter deposition. The metal may be similar to those mentioned above with respect to the formation of the first electrode 120.

Figure 2A:
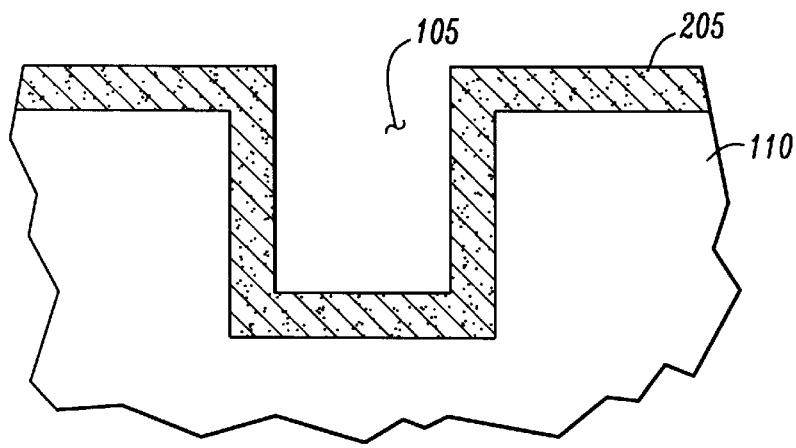
FIGS. 2A–2D illustrate partial sectional views of intermediate devices produced by a method covered by the present invention.
Figure 2B:
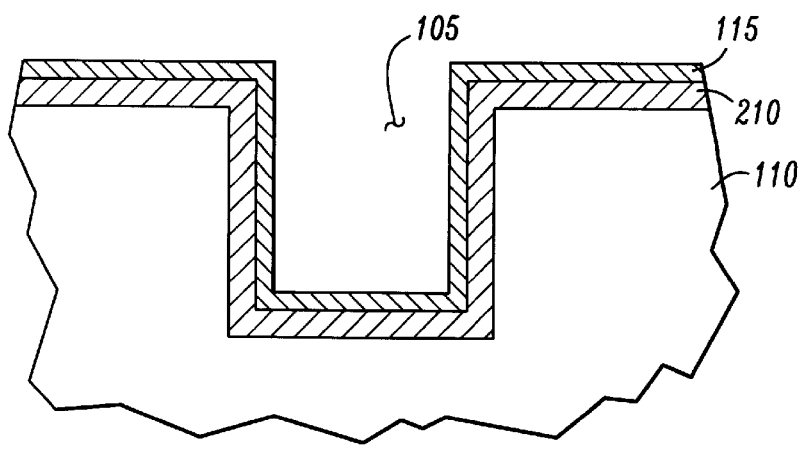

Turning now to FIGS. 2A–2D an alternative fabrication process within the scope of the present invention will now be discussed. This particular embodiment takes advantage of those applications where it is desirable to have a larger area of metal silicide in contact with the bottom electrode of the MOM capacitor. In certain applications, the opening 105 may have a high aspect ratio such that it can be difficult to deposit metal into the opening 105. In such instances, a silicon layer 205, such as polysilicon, is conventionally deposited within the opening 105 formed in the substrate layer 110, as shown in FIG. 2A. The thickness of the silicon layer 205 may vary but a preferred thickness may range from about 20 nm to about 200 nm. The silicon layer 205 may be then be patterned or it may be patterned after the deposition of the metal layer 115. After formation of the silicon layer 205, the metal layer 115 is deposited in the same manner discussed above for the other embodiments and as shown in FIG. 2B. The intermediate device is then subjected to the same first RTP step as discussed above, during which, the silicon layer 205 reacts with a portion of the metal layer 115 to form a metal silicide layer 210 between the substrate 110 and the metal layer 115 everywhere the metal contacts the silicon layer 205. It is desirable that all or at least a substantial portion of the silicon is converted into the metal silicide, because if the silicon is present in a significant quantity shorts within the device can occur. During this first RTP step, the first electrode 120 is formed as previously discussed from a portion of the metal layer 115. The metals and processing parameters may be the same as those discussed above for other embodiments.

Figure 2C:
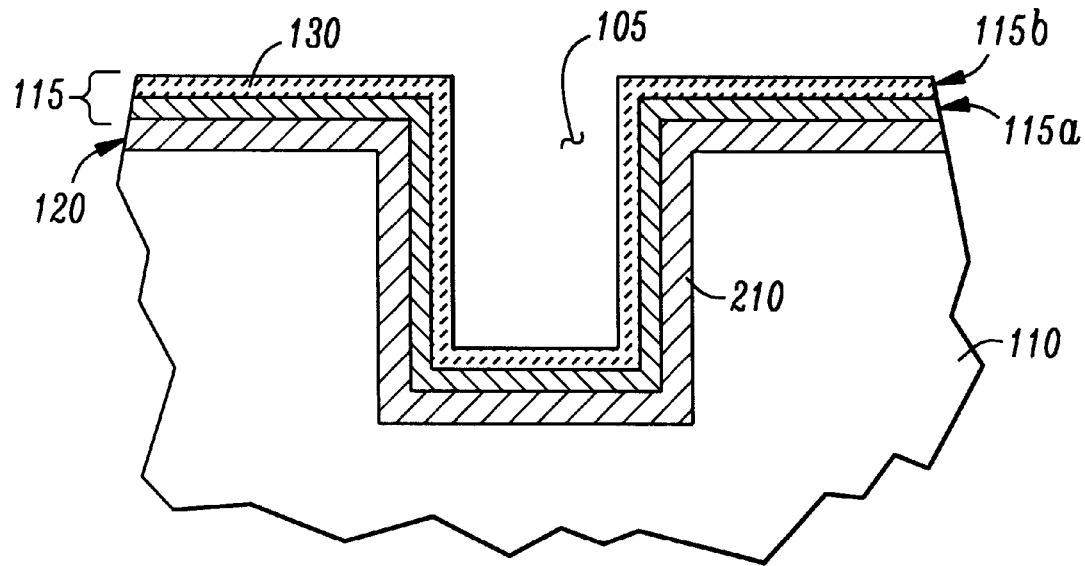
Figure 2D:
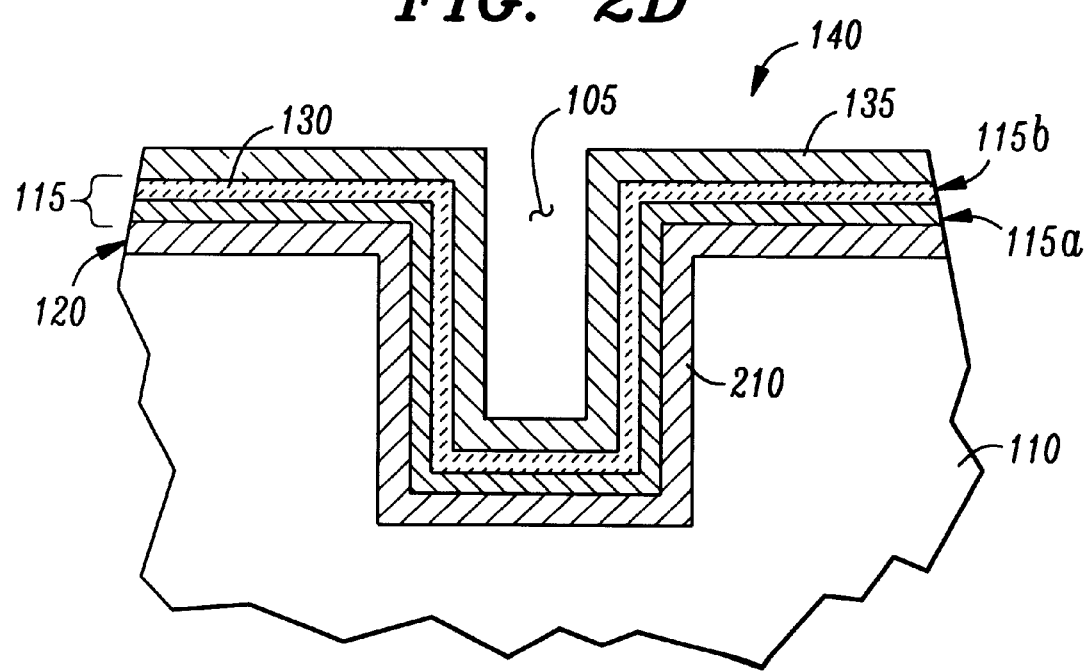

FIGS. 2C–2D illustrate the formation of the first metal electrode 120, and the metal oxide layer 130, which is formed from the remaining metal layer portion 115a. The metal oxide layer 130 and the subsequent second metal electrode 135 are formed in the same manner as previously discussed for other embodiments.

Figure 3:
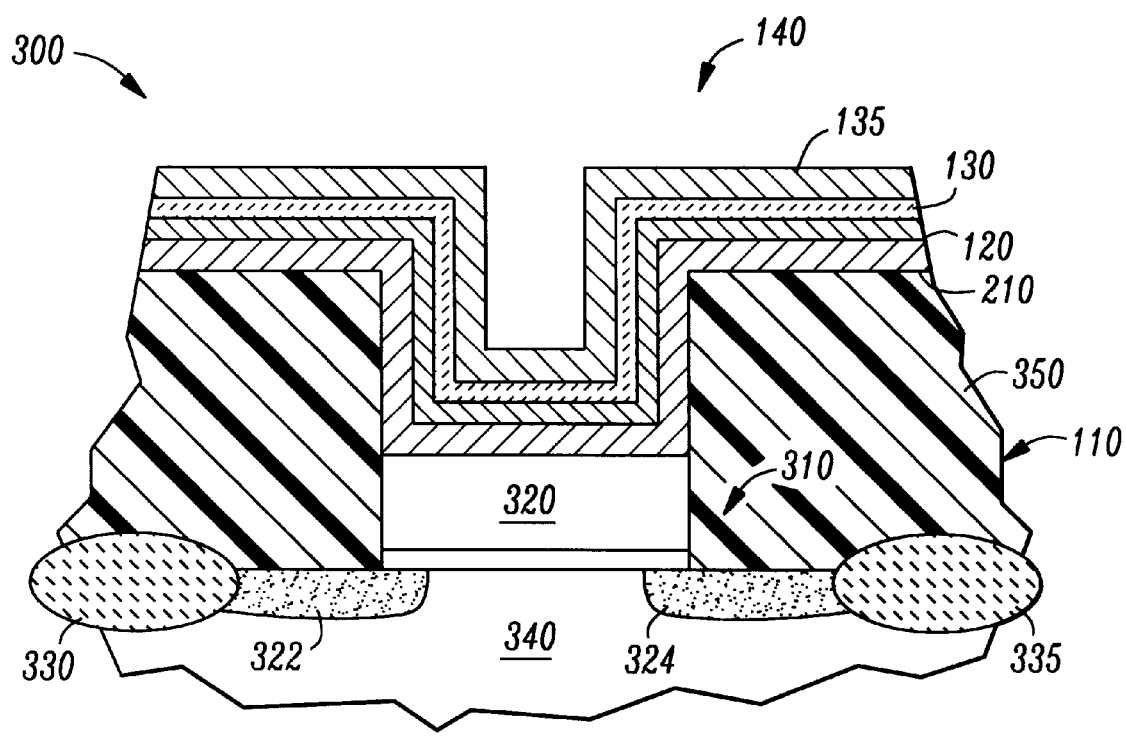
FIG. 3 illustrates a semiconductor device that employs a MOM capacitor constructed according to the principles of the present invention.

Turning now to FIG. 3, illustrated is a semiconductor device 300 that employs a MOM capacitor 140 constructed according to the principles of the present invention. The semiconductor device 300 includes a conventionally formed transistor 310. In the embodiment illustrated, the transistor 310 consists of a gate 320 and separate source and drain regions 322, 324, which in turn, contact first and second field oxide regions 330, 335. The gate 320 is of conventional design and is formed on a substrate 340. A second substrate 350, such as a dielectric material, is deposited over the entire transistor 310. In an advantageous embodiment, the transistor may be either a CMOS or a BiCMOS transistor.

While the illustrated embodiment shows the MOM capacitor 140 formed on the gate 320, other embodiments may include the MOM capacitor being formed on a source/drain or field oxide region. Those skilled in the art will recognize that instead of a single transistor and a single MOM capacitor, numerous transistors and multiple MOM capacitors 110 may be used in the semiconductor device.

Although the present invention has been described in detail, those skilled in the art should understand that they can make various changes, substitutions and alterations herein without departing from the spirit and scope of the invention in its broadest form.

What is claimed is:

1. A method of forming a metal oxide metal (MOM) capacitor on a semiconductor substrate in a rapid thermal process machine, comprising:

forming a metal layer on said semiconductor substrate;

subjecting said metal layer to a first rapid thermal process to form a first metal electrode layer from a portion of said metal layer and form a metal silicide from a first remaining portion of said metal layer and a portion of said substrate;

forming a metal oxide on said first metal electrode from a second remaining portion of said metal layer by subjecting said second remaining portion of said metal layer to a second rapid thermal process in an atmosphere containing oxygen; and forming a second metal electrode layer on said metal oxide.

2. The method as recited in claim 1 wherein subjecting said metal layer includes forming a metal silicide between said first metal electrode layer and said semiconductor substrate.

3. The method as recited in claim 1 wherein forming a metal layer includes forming said metal layer from a metal selected from the group consisting of:

tantalum;

titanium;

cobalt;

nickel; and molybdenum.

4. The method as recited in claim 1 wherein subjecting said metal layer to a first rapid thermal process includes subjecting said metal layer to a rapid thermal process having a temperature ranging from about 400° C. to about 900° C.

5. The method as recited in claim 1 wherein subjecting said metal layer to a second rapid thermal process includes subjecting said metal layer to a rapid thermal process having a temperature ranging from about 500° C. to about 1100° C.

6. The method as recited in claim 1 wherein forming a first metal electrode layer from a portion of said metal layer includes forming a metal silicide on said semiconductor substrate.

7. The method as recited in claim 6 wherein forming a metal silicide includes forming a metal silicide selected from the group consisting of:

tantalum silicide;

titanium silicide;

cobalt silicide;

nickel silicide; and molybdenum silicide.

8. The method as recited in claim 1 wherein forming a metal layer on said semiconductor substrate includes forming a metal layer on a silicon substrate.

9. The method as recited in claim 1 wherein forming a metal oxide by subjecting said remaining portion of said metal layer to a second rapid thermal process in an atmosphere containing oxygen includes introducing a flow of oxygen having a flow rate ranging from about 1 slm to about 40 slm into said rapid thermaln process machine to oxidize said remaining portion of said metal layer.

10. The method as recited in claim 1 further including forming a polysilicon layer on said semiconductor substrate and forming a metal layer includes forming said metal layer on said polysilicon layer.

11. A method of forming a semiconductor device, comprising:

forming a transistor having a gate on a first semiconductor substrate;

forming a metal oxide metal (MOM) capacitor on gate in a rapid thermal process machine, including;

forming a metal layer on said gate;

forming a metal silicide electrode layer from a first portion of said metal layer by subjecting said metal layer to a first rapid thermal process in a substantially inert but nitrogen-free atmosphere;

forming a metal oxide on said metal silicide electrode from a second portion of said metal layer by subjecting said second portion of said metal layer to a second rapid thermal process in an atmosphere containing oxygen; and forming another metal electrode layer on said metal oxide.

12. The method as recited in claim 11 wherein forming a metal layer includes forming said metal layer from a metal selected from the group consisting of:

tantalum;
titanium;
cobalt;
nickel; and
molybdenum.

13. The method as recited in claim 11 wherein subjecting said metal layer to a first rapid thermal process includes subjecting said metal layer to a rapid thermal process having a temperature ranging from about 400° C. to about 900° C. and subjecting said metal layer to a second rapid thermal process includes subjecting said metal layer to a rapid thermal process having a temperature ranging from about 500° C. to about 1100° C., said first and second rapid thermal processes being conducted in a single machine.

14. The method as recited in claim 11 wherein forming a metal silicide electrode layer includes forming a metal silicide electrode layer selected from the group consisting of:

tantalum silicide;
titanium silicide;
cobalt silicide;;
nickel silicide; and
molybdenum silicide.

15. The method as recited in claim 11 wherein forming a metal oxide by subjecting said remaining portion of said metal layer to a second rapid thermal process in an atmosphere containing oxygen includes introducing a flow of oxygen having a flow rate ranging from about 1 slm to about 40 slm into said machine to oxidize said remaining portion of said metal layer, a temperature of said machine ranging from about 500° to about 1000° C.

* * * * *